United States Patent [19]  
Higgins, Jr. et al.

[11] Patent Number: 4,959,624  
[45] Date of Patent: Sep. 25, 1990

[54] COIL-LESS OVERTONE CRYSTAL OSCILLATOR

[75] Inventors: Robert J. Higgins, Jr., Sunrise, Fla.; William J. Ooms, Chandler, Ariz.; James S. Irwin, Bastrop, Tex.

[73] Assignee: Motorola, Inc., Schaumburg, Ill.

[21] Appl. No.: 507,091

[22] Filed: Apr. 9, 1990

Related U.S. Application Data

[63] Continuation of Ser. No. 358,059, May 30, 1989, abandoned.

[51] Int. Cl.$^5$ ............................................. H03B 5/36
[52] U.S. Cl. .............................. 331/116 R; 331/158; 331/177 R
[58] Field of Search ............ 331/116 R, 116 FE, 158, 331/135, 177 R, 177 V

[56] References Cited

U.S. PATENT DOCUMENTS

| | | | |
|---|---|---|---|
| 3,577,099 | 5/1971 | Hall et al. | 331/116 R |
| 3,845,410 | 10/1974 | Steel | 331/116 R |
| 3,875,533 | 4/1975 | Irwin et al. | 331/116 R |
| 4,128,817 | 12/1978 | Gomi | 331/116 R |
| 4,139,826 | 2/1979 | Pradal | 331/116 R |
| 4,743,865 | 5/1988 | Chauvin | 331/116 R |

Primary Examiner—Siegfried H. Grimm  
Attorney, Agent, or Firm—Joseph P. Krause; Steven G. Parmelee; Anthony J. Sarli

[57] ABSTRACT

A crystal oscillator circuit for use with overtone crystals restricts its resonant frequency to either fundamental or overtone frequencies. An inverting amplifier, which provides 180 degrees of phase shift by inverting an input signal, includes components which effectively provide another 180 degree phase shift at a particular frequency by adding a time delay. The 180 degree phase shift by a signal inverting amplifier, with the included 180 degree phase shift provided by the time delay comprises an oscillator by the addition of a crystal with a resonant frequency equal to the particular frequency determined by the time delay. Suppression of unwanted oscillation frequencies is accomplished by adjusting a current source, which changes time delay, without using inductors or other reactive components.

12 Claims, 1 Drawing Sheet

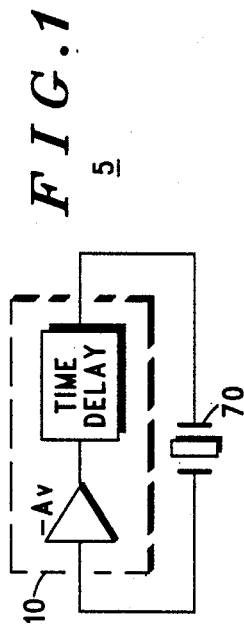
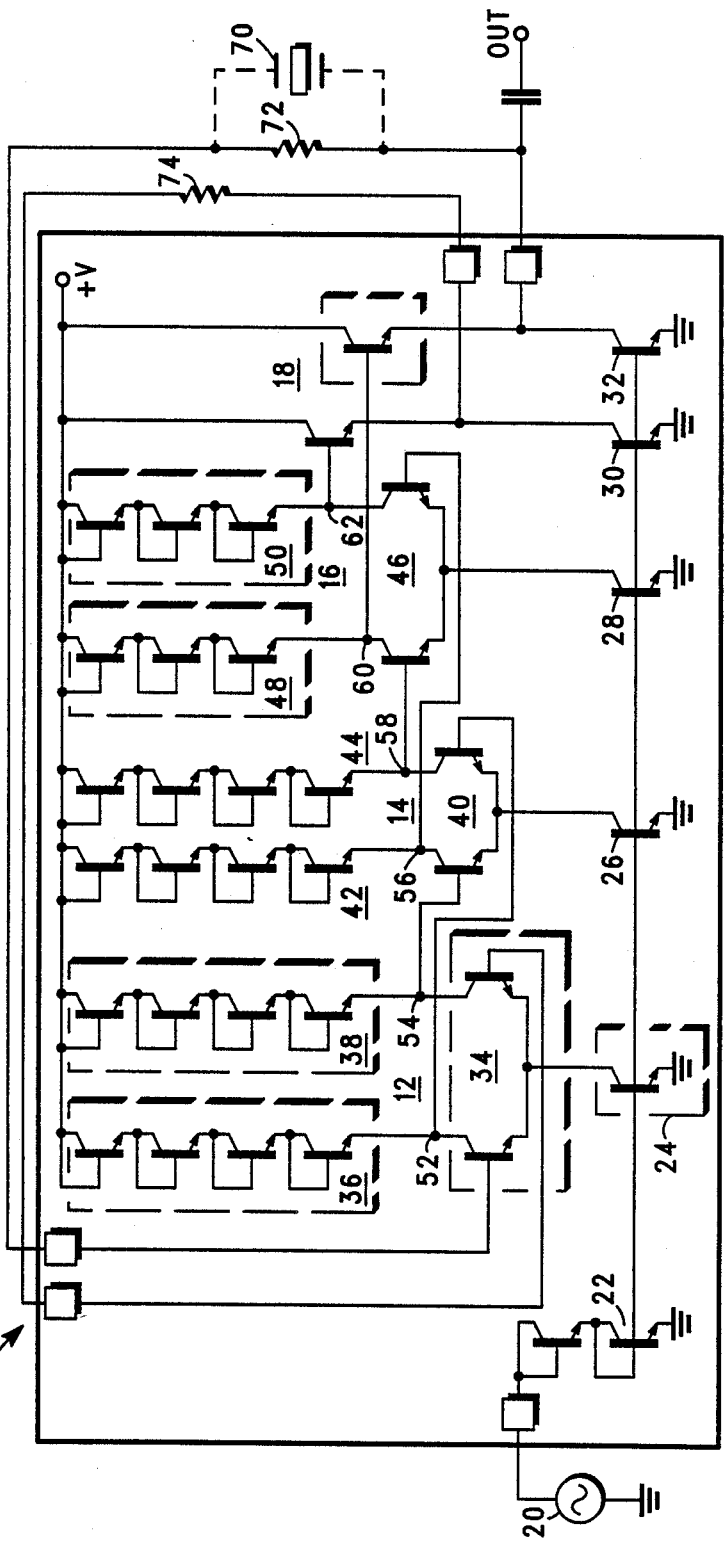
FIG. 1
FIG. 2

COIL-LESS OVERTONE CRYSTAL OSCILLATOR

This is a continuation of application Ser. No., 07/358,059, filed May 30, 1989, and now abandoned.

BACKGROUND OF THE INVENTION

This invention relates generally to oscillators and more particularly to crystal controlled overtone oscillator circuits that prevent oscillations at undesired crystal overtone frequencies.

There are many prior art applications that prevent oscillations of oscillators at undesired frequencies. In particular there are many prior art crystal oscillators that prevent an overtone crystal oscillator from oscillating at undesired overtone frequencies. Prior art techniques for reducing spurious oscillation typically require the usage of reactive components, especially inductive elements, to inhibit oscillation at an undesired frequency.

For example, U.S. Pat. No. 3,845,410 to Steel for a "Crystal Oscillator Having Spurious Oscillation Suppression Circuit" teaches a Colpitts type oscillator having an inductive and resistive element chosen to provide power dissipation at undesired spurious frequencies and to allow only minimal losses to occur at the desired operating frequency. Similarly, U.S. Pat. No. 3,875,533 to Irwin et al discloses a Colpitts oscillator circuit having an external transformer to minimize undesired oscillations.

In the effort to reduce the physical size of circuitry, an oscillator circuit that is capable of oscillating at a crystal overtone while not requiring an external inductor to suppress undesired oscillations would be an improvement.

SUMMARY OF THE INVENTION

There is provided an oscillator circuit capable of resonating at fundamental and overtone frequencies of a piezoelectric crystal resonator that is comprised of an amplifier and a time delay circuit and a piezoelectric crystal resonator connected to form a loop. The amplifier and time delay circuit are operated to provide at least unity gain and zero net phase shift around the loop at a single frequency.

The amplifier and time delay circuits are diode-loaded emitter-coupled logic differential gain stages. Differential-coupled transistors having diode-loaded collector circuits have switching times that are adjustable by adjusting current flowing through the differentially-coupled transistors. Changing the current through the transistors changes the charging rate of the base-emitter junction of these transistors.

Time delay adjustment is established by adjusting bias currents flowing through the differential-coupled transistors in the amplifier circuit. No inductors or capacitors are required to suppress oscillations at undesired frequencies. The oscillation frequency can be adjusted by controlling the bias current for the time delay effected by the circuit.

BRIEF DESCRIPTION OF THE DRAWING

FIG. 1 shows a block diagram of an overtone oscillator using only an external crystal element.

FIG. 2 shows a schematic diagram of an overtone crystal oscillator wherein the crystal is the only external element.

DETAILED DESCRIPTION OF THE PREFERRED EMBODIMENT

Referring to FIG. 1 there is shown a block diagram of an oscillator circuit (5) using an inverting gain block with a time delay. A piezoelectric resonator or crystal (70) is connected across the gain block and time delay circuit (10). The crystal (70) normally has at least one resonant frequency at which it introduces no phase shift into the oscillator circuit. At frequencies away from its resonant frequency, the crystal phase shifts a voltage across it preventing the circuit from oscillating. The oscillator circuit (5) will oscillate when the voltage gain of the loop is at least one and the net phase delay around the loop is zero degrees. The oscillator circuit (5) can be made to oscillate at either a fundamental frequency of the crystal (70) or an overtone frequency of the crystal (70) solely by adjusting a bias current which adjusts the time delay of the circuit. No external reactive elements to suppress unwanted oscillations are required.

Referring to FIG. 2, there is shown a detailed schematic of the oscillator circuit (5) of FIG. 1 including the gain block and time delay circuit (10). The gain block and time delay circuit (10) in the preferred embodiment, with the exception of the crystal, a current source and bias resistors, is integrated on a single substrate. External feedback resistors (72 and 74) shown as external to the oscillator circuit (10) could be integrated onto the substrate of the IC rather than being external circuit components.

The gain block and time delay circuit (10) includes three diode-loaded ECL (emitter coupled logic) gain stages (12, 14 and 16) each stage including differential-coupled transistors (34, 40 and 46) with series-connected diodes in the collector circuits. Each of the differential gain stages (12, 14 and 16) nominally provides a voltage gain and each nominally provides a 180 degree phase shift between an input voltage and an output voltage.

These three gain stages (12, 14 and 16) each provide a 180 degree signal inversion. Cascading three inverting stages therefor also provides a net phase shift of 180 degrees as well. Each gain stage (12, 14, and 16) however, includes diode-loaded collector circuits which have current adjustable switching times. The current-adjustable switching times of the diode-loaded collector circuits effectively add a time delay to each amplifier stage. If the total time delay provided by the three diode loaded collector circuits equals the time period of a particular frequency at which oscillation is desired, the delay time of one cycle period will be functionally equivalent to another 180 degree phase reversal thereby providing a net phase shift of zero degrees. The effective 180 degree phase reversal (provided by the time delay provided by the diode loaded collector circuits) in conjunction with the signal inversion provided by the three cascaded gain stages (12, 14, and 16) will provide a phase shift of 0 degrees at one particular frequency, the frequency at which the time delay provided by the diode loaded collector circuits (36, 38, 42, 44, 48, and 50) equals a 180 degree time period.

The oscillator circuit (5) as shown in FIG. 1 has at least one natural resonant frequency at which it will oscillate, which is a function of the time delay through the gain and time delay stage. To sustain oscillation, the gain around the loop must be at least unity and the net phase shift around the loop must be substantially zero. If the amplifier provides a 180 degree phase shift, the time delay circuit must provide a delay time effectively equal to another 180 degree delay. In the oscillator circuit (5) shown in FIG. 2, the resonant frequency, $f_0$, is varied by adjusting a bias current that adjusts the time delay experienced through the gain stages (12, 14 and 16) of the gain block and time delay circuit (10).

The bias current for the gain block and time delay circuit (10) from the bias current source (20) changes the time delay through the oscillator (10) by changing the bias current through each of the differential gain stages (12, 14 and 16). Changing the current from the current source (20) changes current in the current mirror (22) in turn changing the quiescent current flowing through each of the constant current sources (24, 26, 28, 30 and 32). Current through current sources (24, 26, and 28) coupled to the differential pairs (34, 40, and 46) is split between the collector circuits of the respective differential stages (12, 14 and 16).

By using diode-loaded collector circuits for the differential transistor pairs (34, 40 and 46) the quiescent voltage at the respective collectors (52, 54, 56, 58, 60 and 62) is constant and does not change regardless of the bias currents flowing through the transistors. For example, the voltage at collector (52) of the first differential pair will always be four diode drops below VCC regardless of the current through current source (24). While the collector voltages will be relatively constant, the switching time of these differential stages (12, 14 and 16) can be adjusted by changing the current through the constant current sources (24, 26 and 28). As the current through the constant current sources changes, the switching times of the differential pairs will change principally because of the charging rate of the base-emitter junction of these transistors by the bias of the constant current source. Changing the switching times of the differential pairs will effectively change the temporal delay (time delay) between the input and the output of the gain block thereby adjusting the resonant frequency, $f_0$ of the circuit (5). Diode loaded collector circuits have the advantage that the capacitance to ground is smaller than would be the case with a resistive load and when the circuit switches it is only switching four diode drops rather than a changing voltage attributable to a resistive collector circuit.

As the current through the constant current sources (24, 26 and 28) of the differential pairs (34, 40, and 46) increases, more current flows through each half of the differentially coupled transistors (34, 40 and 46). As the current through these transistors increases, the switching time required to change state decreases, effectively decreasing the propagation delay across the oscillator circuit (10).

From the foregoing it can be seen that adjusting the bias current from the current source (20) the propagation across the oscillator (10) can be controlled, thereby determining the resonant frequency of the loop shown in FIG. 1.

To prevent undesired or spurious oscillation at undesired frequencies the propagation delay around the loop must not provide a phase-shift of odd multiples of 180 degrees or the voltage gain of the circuit at the harmonic must be less than one. Bias current from the current source (20) must therefore be adjusted such that the time delay accomplishes a 180 degree phase shift at the desired frequency.

It should be noted that, the small signal gain of the differential pairs (34, 40 and 46) is a function of the number of diodes in their respective collector circuits. Increasing the number of diodes in the collector circuits increases the gain per stage. In the preferred embodiment as shown in FIG. 2, three diodes were used in the last differential pair stage (46) rather than four, as used in the first two stages, to limit the small signal gain of the circuit at the undesired overtone.

The emitter follower stages (18) shift the output impedance of the circuit to a relatively low impedance and increase the output current drive capability as well. The constant current sources (30 and 32) coupled to the emitter follower stages (18) serve to bias the emitter follower transistors.

Using the circuit described above a crystal oscillator can be constructed to oscillate at an overtone frequency or fundamental, without operating at spurious frequencies, solely by adjusting a biased current source. No external inductor or capacitor is required to suppress undesired oscillations. The circuit may be completely integrated upon a single integrated circuit substrate with the exception of an external crystal, reducing parts count and physical size of the oscillator circuit.

What is claimed is:

1. An oscillator circuit capable of oscillating at a resonant frequency of a resonator comprised of:
    inverting amplifier means having an input and an output for amplifying and inverting a signal, said inverting amplifier means including time delay means for temporally delaying signals in said amplifier means between said input and said output of said amplifier means, a time delay provided by said time delay means and signal inversion performed by said amplifier means providing signals at at least one frequency at the output of said inverting amplifier means that are amplified from and substantially in phase with signals at said input of said amplifier means;
    resonator means having at least one resonant frequency corresponding to said at least one frequency at the output of said amplifier means, for phase-shifting signals at frequencies away from said at least one resonant frequency, said resonator means coupled between said amplifier means input and output to provide a circuit capable of oscillating at said at least one resonant frequency of said resonator means.

2. The oscillator of claim 1 wherein said amplifier means includes means for substantially continuously changing the amount of time delay.

3. The oscillator of claim 1 wherein said amplifier means is integrated onto a single integrated circuit substrate.

4. The oscillator of claim 1 wherein said amplifier means includes at least one inverting gain stage.

5. The oscillator of claim 1 wherein said amplifier means includes diode-loaded emitter coupled logic gain stages.

6. An oscillator circuit capable of resonating at a desired frequency of a crystal resonator, comprised of:
    inverting amplifier means, having an input and an output, for receiving a signal at said input, for amplifying, for inverting, and for adjustably time delaying said signal at said input, such that a signal at said output is substantially in phase with said signal at said input at substantially one frequency; and
    at least one crystal resonator coupled between said input of said amplifier and said output of said amplifier.

7. The oscillator of claim 6 wherein said inverting amplifier means includes means for changing the amount of time delay.

8. The oscillator of claim 7 wherein said means for changing time delay changes said delay by changing an electric current.

9. The oscillator of claim 6, wherein said inverting amplifier means is integrated onto a single integrated circuit substrate.

10. The oscillator of claim 6 wherein said amplifier means includes at least one inverting gain stage.

11. The oscillator of claim 6 wherein said amplifier means includes diode-loaded emitter coupled logic gain stages.

12. The oscillator of claim 6 wherein said crystal resonator has an overtone resonant frequency.

* * * * *